United States Patent [19]

Fulton

[11] Patent Number: 5,068,863
[45] Date of Patent: Nov. 26, 1991

[54] COMPENSATING CIRCUIT FOR HIGH POWER LASERS

[75] Inventor: Forrest F. Fulton, Los Altos Hills, Calif.

[73] Assignee: Wavelengths Lasers, Inc., Palo Alto, Calif.

[21] Appl. No.: 512,296

[22] Filed: Apr. 17, 1990

[51] Int. Cl.⁵ .......................................... H01S 3/133
[52] U.S. Cl. .......................................... 372/31; 372/38
[58] Field of Search .................. 372/29, 31, 33, 38; 455/609, 608; 250/205

[56] References Cited

U.S. PATENT DOCUMENTS

| | | | |
|---|---|---|---|
| 4,075,474 | 2/1978 | Straus et al. | 455/602 |
| 4,101,847 | 7/1978 | Albanese | 372/31 |
| 4,672,192 | 6/1987 | Muka et al. | |
| 4,733,398 | 3/1988 | Shibagaki | 372/26 |
| 4,912,714 | 3/1990 | Hatanaka et al. | 372/31 |

Primary Examiner—Frank Gonzalez
Assistant Examiner—Susan S. Morse
Attorney, Agent, or Firm—Townsend and Townsend

[57] ABSTRACT

A circuit which improves the linearity of a high power laser diode is disclosed. A electrical diode is coupled to the anode of the laser diode and a filter/bias network back biases the laser diode and forward biases the PN diode. At lower current levels the amount of current flowing through the laser diode is lowered. At higher current levels, rolloff in the PN diode allows more current through the laser diode. The rolloff performance of the laser diode and PN diode mirror each other closely enough to improve the laser's linear performance by 3 dB to 5 dB.

11 Claims, 4 Drawing Sheets

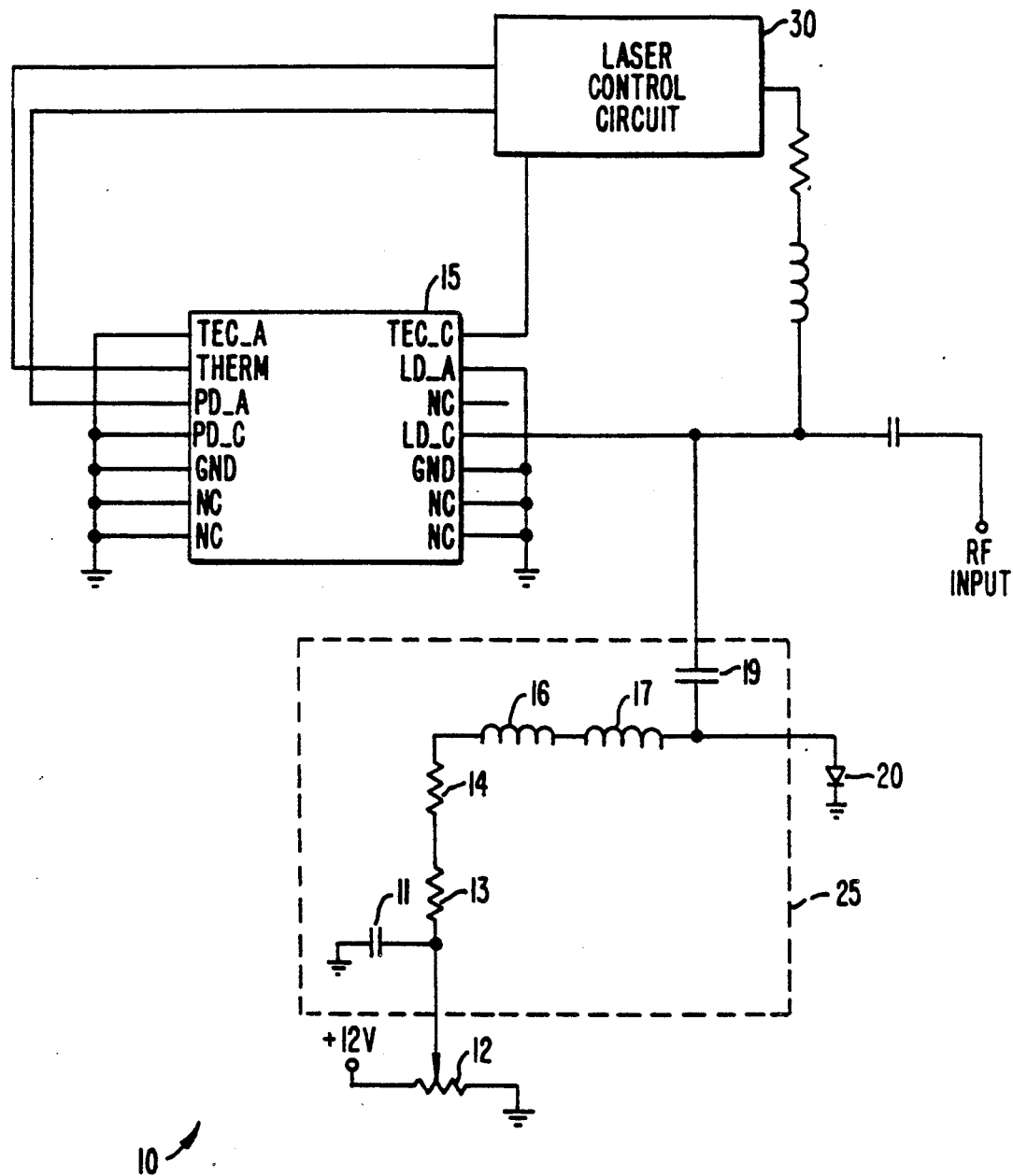
FIG._1.

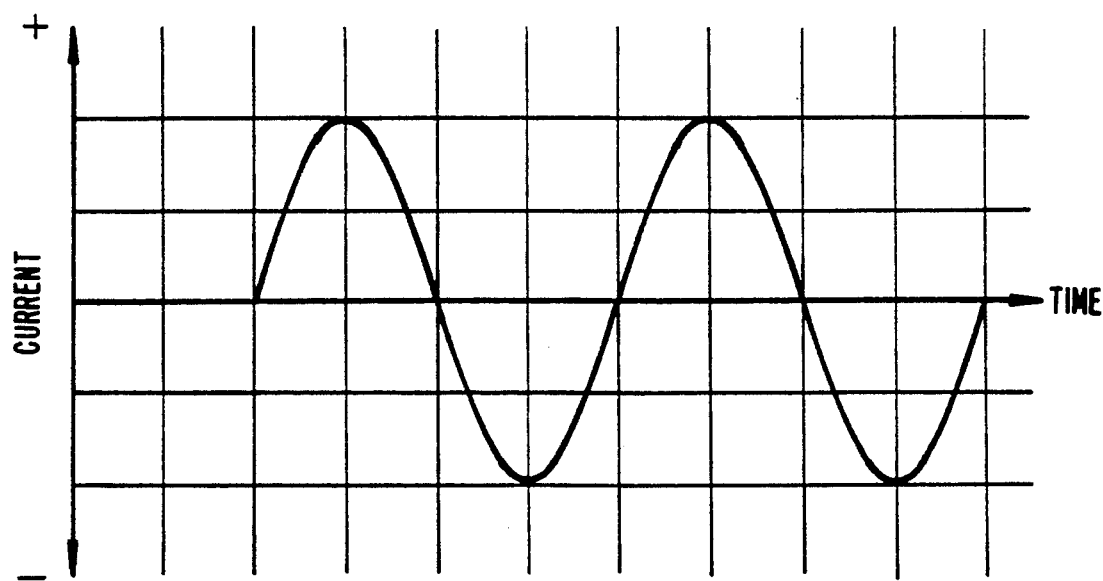
FIG._2.
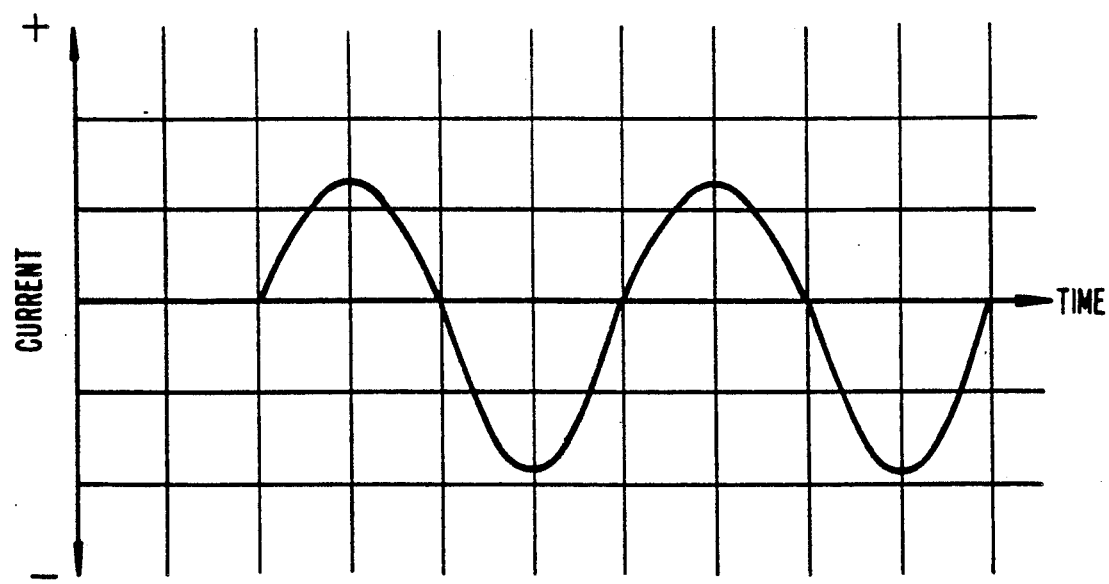
FIG._3.

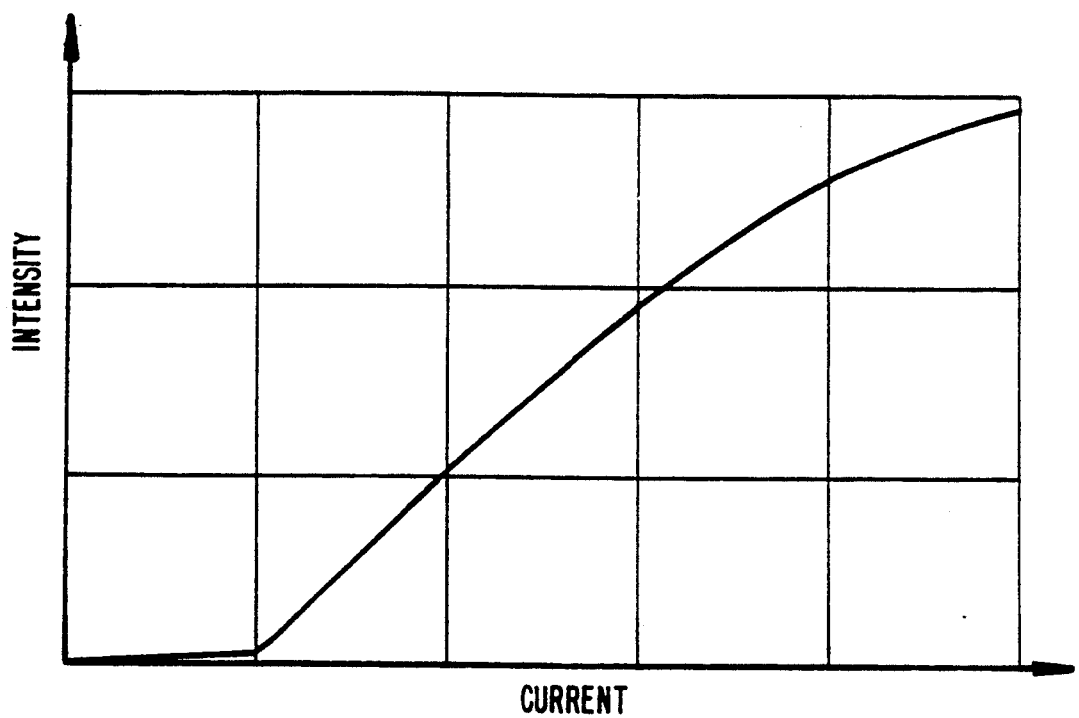
FIG._4.
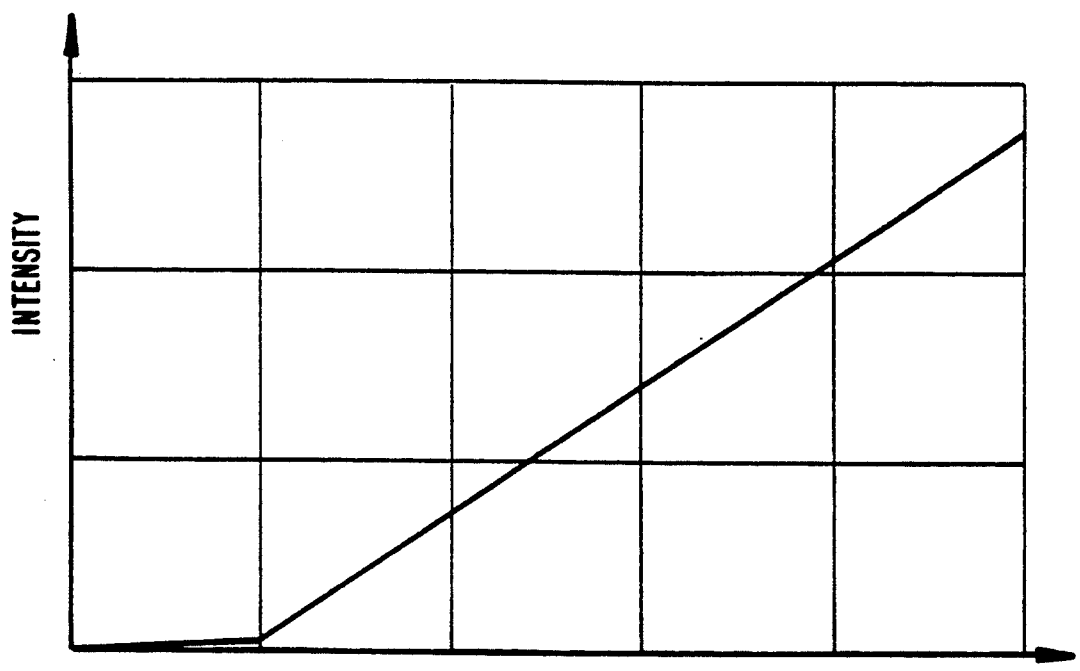
FIG._5.

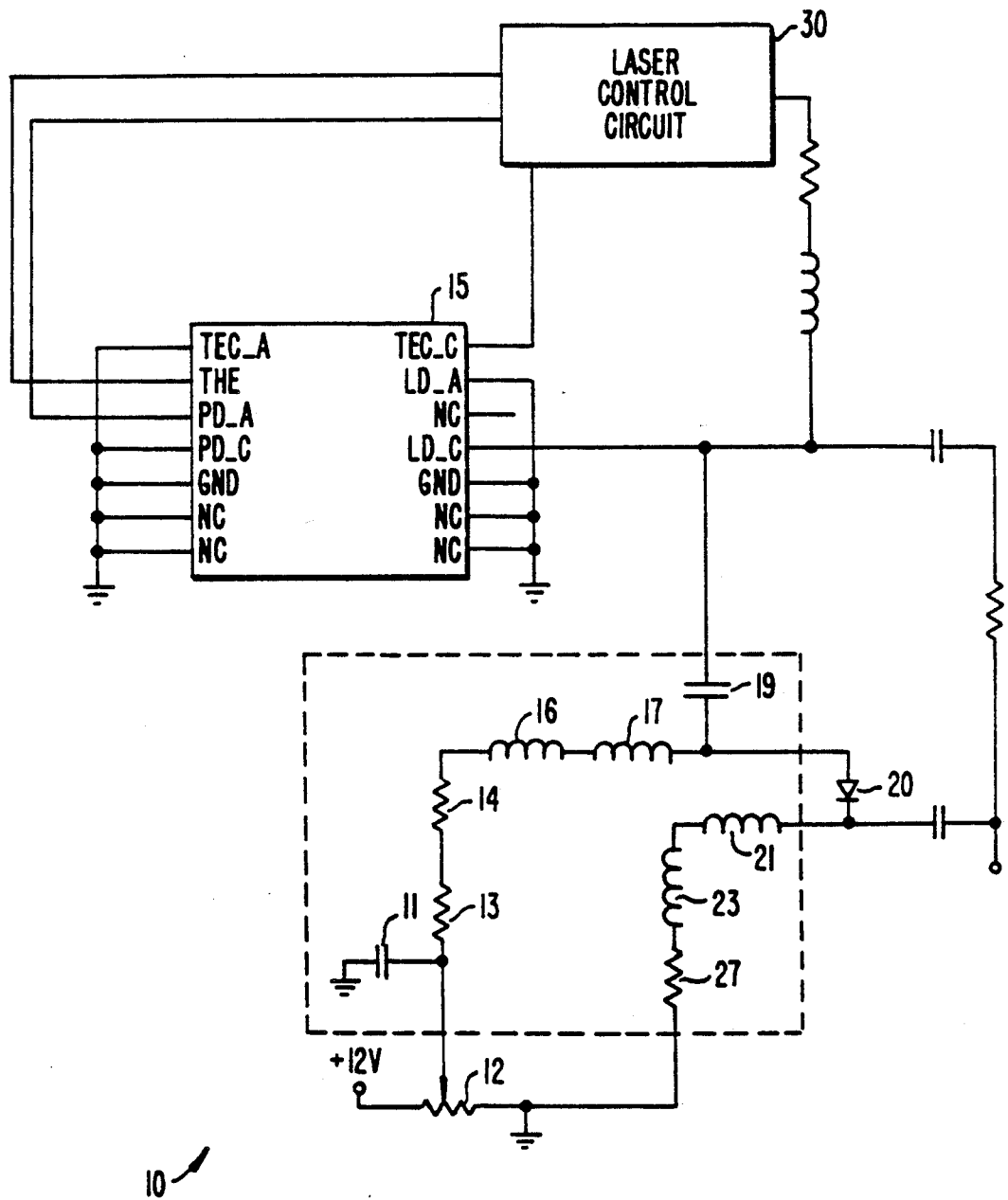
FIG._6.

COMPENSATING CIRCUIT FOR HIGH POWER LASERS

BACKGROUND OF THE INVENTION

1. Field of the Invention

This invention is in the field of lasers. In particular, it is a circuit for improving the linearity of high power lasers when such lasers are used to transmit high frequency amplitude modulated ("AM") input signals.

2. Description of the Relevant Art

The use of lasers to transmit information over fiber optic waveguides is known. The ability of such laser/fiber optic networks to transmit large amounts of information quickly far exceeds that of conventional electrically conductive media.

Despite the benefits of high speed and high density data transmission, most lasers currently available for use with such networks have a relatively small power output Attempts to develop solid state lasers which operate at higher power output levels have not been completely successful. Although some high power laser are now available, they have significant nonlinearities when operated at these higher power levels. In particular, as the input current level increases, the output light levels do not increase linearly therewith. This defect is known as "rolloff."

Several techniques have been developed which reduce these nonlinearities and distortion. Muka, et al, U.S. Pat. No. 4,672,192, teaches the use of an acoustooptic cell which receives a noisy input laser signal and uses sampling and feedback techniques to reduce the noise. The Muka, et al., system is complicated and expensive, requiring numerous precision optical components.

Shibagaki, et al., U.S. Pat. No. 4,733,398, uses a feedback arrangement to produce an error signal indicating the difference between the input and output signals. An integration device then produces an average value signal from the difference to obtain a control signal, which in turn is used to modulate the laser's input signal. This system is also complex and requires expensive components.

Straus, et al., in U.S. Pat. No. 4,075,474, teaches an optical transmitter which utilizes two matched light emitting diodes to achieve distortion reduction. Straus, et al., modulates the electrical-to-optical converter using a modified signal. The modified signal is obtained using a matched emitting device, presumably a semiconductor laser, which is used to drive an optical receiver. Errors in the received signal versus the driving signal are subtracted from the signal used to control the optical driver which actually emits the signal for the optical fiber. While Straus, et al., is suitable for some applications, it is undesirable for high power applications because of the necessity of acquiring two matched high power lasers. Not only is it extremely difficult to obtain matched high power lasers, the substantial expense involved is highly undesirable.

Straus, et al., in "Linearized Transmitters for Analog Fiber Links," *Laser Focus*, Oct. 1978, pp. 54–61, describes an optical feed forward system in which the input signal is used to drive an amplifier for the LED. The LED output is monitored and supplied to an error control. The error control also receives the original input signal after an appropriate delay, then compares the two and uses them to drive a correcting LED. A significant disadvantage of the approach employed by Straus, et al., is that the LEDs must be carefully matched. The entire system is predicated on the accuracy of the correcting LED matching the driving LED. Consequently, the minimum cost of the system is twice the price of the LEDs employed. An additional disadvantage is that because Straus, et al., does not tap the fiber to detect the signal on it, the errors corrected cannot match the actual signal as closely as is otherwise desired. A further disadvantage is that Straus, et al., monitors the driving LED by monitoring light which misses the fiber. As power changes, the LED output beam will widen and have a nonuniform power density. Thus, measuring the LED error signal at the input to the fiber does not accurately describe the nature of the signal present within the fiber.

The cited references do not discuss the fact that the electrical input signal to the laser/fiber optic network may be at a level which exceeds the linear operating range of the laser. Making a large reduction in the modulation of the input signal is not effective, as the received modulation would become too noisy.

A need therefore exists for a system which can reduce laser distortion by modifying the electrical input signal to such a laser in an inexpensive and functional manner.

SUMMARY OF THE INVENTION

The present invention improves the linearity of a high power laser by predistorting the AM input signal to the laser. As the desired output performance is a linear increase in output light intensity as the input signal's current increases, a network is created and coupled to the laser which at low current levels reduces the current applied to the laser. At higher input current levels, a greater proportion of the input signal's current is applied to the laser. By thus lowering and "distorting" the input signal, the linear output of the laser at higher modulation power levels is maintained and the full amplitude of the signal's modulation can be restored by increasing the RF signal level.

The invention comprises a high power laser, a small Schottky barrier diode and a combination filter/bias network. The anode of the Schottky barrier diode and the cathode of the laser diode are coupled together through a D.C. blocking capacitor. The cathode of the Schottky diode is grounded. An RF signal is injected at the junction of the laser and Schottky diode through another D.C. blocking capacitor. The filter/bias network is also coupled to this junction. Adjustment of the filter/bias network results in the Schottky diode being forward biased. The laser is forward biased by a regulating circuit. At positive RF input signal current levels, the diode conduction results in a reduction of the current flowing to the laser. As the input goes negative, a larger portion of the input signal is applied to the laser. By so scaling the input current by the action of the Schottky diode, the laser is made to operate in a more linear manner than if the modulating current were only applied to the laser.

This circuit is particularly practical because the predistorting of the signal requires only an inexpensive Schottky diode and a simple filter network. Although the Straus, et al., patent shows the use of matched LEDs to correct the output signal, the use of an inexpensive diode on the input signal to produce the "mirror image" high current rolloff performance of an expensive laser is entirely unknown.

The invention will now be described in detail in conjunction with the following figures.

BRIEF DESCRIPTION OF THE DRAWINGS

FIG. 1 is a schematic diagram of a first embodiment of the present invention;

FIG. 2 is a typical RF input signal;

FIG. 3 shows the RF input signal modulating the laser when the present invention is coupled to the laser;

FIG. 4 is an output intensity versus input current graph for a laser without the present invention being coupled thereto; and FIG. 5 is the output light intensity versus input current for a laser coupled to the present invention; and FIG. 6 is a schematic diagram of a second embodiment of the present invention.

DETAILED DESCRIPTION OF THE PREFERRED EMBODIMENTS

FIG. 1 is a schematic drawing which illustrates a preferred embodiment of the invention. The circuit comprises high power linear laser 15, diode 20, bias potentiometer 12 and inductor-capacitor-resistor filter circuit 25 comprising capacitors 11 and 19, resistors 13 and 14, and inductors 16 and 17.

In a typical application, one of the most linear lasers 15 available today is a distributed feedback laser of a few milliwatt output power level. Such lasers are commercially available from American Telephone & Telegraph, Mitsubishi, and other companies. The exact choice of this component will be based upon the envisioned applications for the laser. This type of linear laser is relatively expensive, costing approximately $7,000. Laser control circuit 30 is coupled in the indicated manner to laser 15. The control circuit does not affect the operation of the present invention and is not further discussed herein.

Diode 20 is a conventional Schottky barrier electric diode, both low in cost and readily available. The anode of diode 20 is coupled through capacitor 19 to the cathode of laser 15.

Resistors 13 and 14 and inductors 16 and 17 are coupled together in series, one lead of inductor 17 being coupled to the junction of diode 20 and capacitor 19. The other end of the series combination is coupled to one terminal of capacitor 11 and variable resistor 12. The other terminal of capacitor 11 is coupled to ground. The other two terminals of variable resistor 12 are coupled to a +12 V power source and ground.

Resistors 14 and 13, inductors 16 and 17, and capacitors 11 and 19 form filter network 25. The filter network prevents the RF input signal from flowing into the +12V power source.

By adjusting variable resistor 12, diode 20 can be forward biased. The magnitude of the bias current which flows through diode 20 is roughly 5 milliamperes. The current which flows through the laser 15 is roughly 50 milliamperes.

In operation, an RF signal is injected at the RF input in FIG. 1. The signal may be in the range of 50 to 550 mHz. The waveform shown in FIG. 2 is typical of the type of RF signal that may be applied.

FIG. 3 shows the RF input signal when the predistortion circuit described herein is coupled to the laser. The small current flow through diode 20 reduces the average input intensity by approximately 10% at low current levels. As the current levels increase and decrease with the modulation waveform, rolloff in diode 20 results in less or more current being directed through laser 15, resulting in a more linear modulation to light output relationship.

FIGS. 4 and 5 are output intensity versus input current level graphs for laser 15 without and with the present invention being coupled thereto. In FIG. 4, at high input current levels, an increase in input current does not result in a corresponding increase in light intensity output. FIG. 5 shows how the present invention, coupling another diode to the anode of the laser and biasing it in the opposite direction to the laser, improves the performance of the laser by largely eliminating high current rolloff. This performance improvement is achieved without resorting to the use of expensive matched components. Instead, it is achieved by the use of an inexpensive diode and a simple filter/bias network.

FIG. 6 is a schematic circuit diagram of a second preferred embodiment of the present invention. The components in FIG. 6 have the same part numbers as components in FIG. 1 where the two sets of components correspond to one another. In this second embodiment inductors 21 and 23 as well as resistor 27 are coupled together in series and then the combination is coupled to diode 20 in series. The series combination of diode 20, inductors 21 and 23, and resistor 27 is then also coupled to ground.

Although exact component types have been noted for various components in the present invention, nothing herein should be read to restrict the present invention to those specific components. The foregoing has been a description of several preferred embodiment of the invention, and it is apparent that various modifications or substitutions may be affected without departing from the spirit of the invention, which is set for in the appended claims. In particular, laser 15 may be manufactured by several different companies. To obtain optimum output characteristics from this compensating circuit when different lasers are used, diode 20 has several embodiments. Other diode technologies other than Schottky barrier diodes may be used. Several diodes may be connected in series to act as diode 20, or several diodes may be connected in parallel for the same purpose. Also, the diode may be connected in series with the laser. In any of these alternate embodiments, inductors and capacitors may also be coupled in series with the diode or diodes to tune the circuit's output performance even more precisely. In light of these different embodiments, the specification and claims should be interpreted in a broad rather than restrictive sense.

We claim:

1. In a system wherein a high frequency electrical signal is converted into a high frequency amplitude modulated optical signal, a circuit for reducing distortion which occurs during conversion, the circuit comprising:

laser means coupled to receive the electrical signal, for converting the electrical signal into an optical signal;

diode means coupled in parallel with the laser means and also being coupled to a ground potential source; and biasing means coupled to a power supply and ground, the biasing means also being coupled to the diode means, the biasing means forward-biasing the diode means so that a portion of the electrical signal flows to the ground potential source through the diode means, the diode means and the biasing means reducing the amplitude of the electrical signal going to the laser means during one polarity of the electrical signal and increasing the amplitude of the electrical signal to the laser means during the opposite polarity.

2. The circuit of claim 1 wherein the laser means is a semiconductor laser.

3. A signal conditioning circuit for a light-emitting diode laser having an electrical signal input and laser signal output, the circuit comprising:

Schottky diode means having anode and cathode, one of the cathode and anode being coupled to the electrical signal input and the other of the cathode and anode being coupled to a ground potential;

bias means coupled to the diode means for forward biasing the Schottky diode means; and filter means for preventing the electrical signal input from flowing into the bias means.

4. The circuit of claim 2 wherein the bias means comprises a potentiometer and a power supply.

5. The circuit of claim 3 wherein the filter means comprises resistor/capacitor/inductor network.

6. The circuit of claim 1 wherein the diode means comprises at least two diodes coupled in series.

7. The circuit of claim 1 wherein the diode means comprises at least two diode means coupled in parallel.

8. The circuit of claim 1 wherein a capacitor means is coupled in series with the diode means between the diode means and the ground.

9. The circuit of claim 1 wherein an inductor means is coupled in series with the diode means between the diode means and the ground.

10. The circuit of claim 1 wherein an inductor means and a resistor means are coupled in series to the diode means and a ground voltage.

11. The circuit of claim 10 wherein the inductor means comprises two inductor means coupled in series.

* * * * *